United States Patent
Fournel et al.

(10) Patent No.: US 6,653,684 B2
(45) Date of Patent: Nov. 25, 2003

(54) INTEGRATED CIRCUIT INCLUDING HIGH-VOLTAGE AND LOGIC TRANSISTORS AND EPROM CELLS

(75) Inventors: Richard Fournel, Lumbin (FR); Eric Mazaleyrat, Crolles (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/748,711

(22) Filed: Dec. 22, 2000

(65) Prior Publication Data

US 2001/0019163 A1 Sep. 6, 2001

(30) Foreign Application Priority Data

Dec. 28, 1999 (FR) .............................. 99 16601

(51) Int. Cl.⁷ ............................... H01L 29/788
(52) U.S. Cl. .................. 257/319; 257/316; 257/326
(58) Field of Search ................ 257/314–316, 257/319–321, 326

(56) References Cited

U.S. PATENT DOCUMENTS

| 4,471,373 A | | 9/1984 | Shimizu et al. | |
|---|---|---|---|---|
| 4,651,406 A | | 3/1987 | Shimizu et al. | |
| 5,182,719 A | | 1/1993 | Kuroda et al. | |
| 5,212,541 A | * | 5/1993 | Bergemont | 257/202 |
| 5,270,944 A | | 12/1993 | Kuroda et al. | |
| 5,589,699 A | | 12/1996 | Araki | |
| 5,850,092 A | * | 12/1998 | Cappelletti | 257/321 |
| 6,281,544 B1 | * | 8/2001 | Hong | 257/314 |

FOREIGN PATENT DOCUMENTS

EP  0 379 449  7/1990

OTHER PUBLICATIONS

Patent Abstracts of Japan vol. 018, No. 464 (E–1598), Aug. 29, 1994 & JP 06 151879, May 31, 1994.

* cited by examiner

*Primary Examiner*—Allan R. Wilson
(74) *Attorney, Agent, or Firm*—Wolf, Greenfield & Sacks, P.C.; James N. Morris

(57) ABSTRACT

An integrated circuit including logic MOS transistors, EPROM cells, and high-voltage MOS transistors. Each EPROM cell includes a floating gate formed from a first polysilicon level above a tunnel oxide and a control gate formed from a second polysilicon level. Each logic MOS transistor includes a gate formed from a portion of the second polysilicon level above a very thin oxide. Each high-voltage transistor includes a gate corresponding to a portion of the first polysilicon level above a layer of said tunnel oxide, the gate being covered with a portion of the second polysilicon layer, except at locations where a contact is desired to be made with the gate. The uncovered portion of the first polysilicon layer in the high-voltage MOS transistors is coated with a silicon nitride layer.

26 Claims, 4 Drawing Sheets

INTEGRATED CIRCUIT INCLUDING HIGH-VOLTAGE AND LOGIC TRANSISTORS AND EPROM CELLS

BACKGROUND OF THE INVENTION

1. Field of the Invention

The present invention relates to the manufacturing of integrated circuits including various types of elementary components, and especially logic MOS transistors, of complementary types (CMOS), EPROM cells, and transistors having a higher breakdown voltage than logic MOS transistors. Of course the present invention does not exclude other components, and even bipolar components, from being formed in the same integrated circuit.

2. Discussion of the Related Art

FIGS. 1A, 1B, and 1C show respectively a cross-section view along a line A—A, a top view, and a cross-section view along a line C—C of an EPROM cell. FIGS. 2A, 2B, and 2C show respectively a cross-section view along a line A—A, a top view, and a cross-section view along a line C—C of a logic MOS transistor. The two components are formed in the same integrated circuit. The case where the integrated circuit structure is extremely miniaturized is more specifically considered, for example, structures in which the width of an elementary pattern may be 0.25 μm.

The elementary components are formed in areas that may be specifically doped of a P-type substrate 1. This substrate will generally be an epitaxial layer formed on a silicon substrate. But it may also be a thin silicon layer on an insulator. The various components are separated from one another by thick oxide areas 3. Preferably, the thick oxide areas are made according to a so-called STI (shallow trench insulation) technique consisting of digging trenches into the substrate, then filling the trenches with oxide. This filling is generally performed by uniform deposition of an oxide layer followed by a chem-mech polishing. Although the upper surface of the oxide filling trenches 3 is shown as being exactly at the same level as the upper surface of silicon substrate 1 in the appended drawings, there may in practice exist a slight jutting out.

The EPROM cell includes a floating gate 5 formed of a portion of a first polysilicon layer formed above a thin oxide layer 7, sometimes called a tunnel oxide. The floating gate is coated and surrounded with a thin insulator layer, for example an oxide-nitride-oxide (ONO) sandwich, and is then coated with a portion of a second polysilicon layer 11 forming a control gate and, in the embodiment shown, surrounded therewith. Spacers 13 are formed along the lateral walls of second polysilicon layer 11. Various implantation steps are provided to form source and drain regions. A first implantation 15-1, 15-2 is masked by first polysilicon layer 5. A second implantation 16-1, 16-2 is masked by second polysilicon layer 11. A third implantation 17-1, 17-2 of high doping level is masked by the structure widened by spacers 13.

The active area of the EPROM cell corresponds in the top view of FIG. 1B to the inside of a rectangle 20 surrounded with thick oxide. The entire structure is coated with a thick insulating layer 23, preferably planarized. In this insulating layer are formed openings 24, 25, 26 intended for respectively making contact with source 17-1, drain 17-2, and control gate 11. As better shown in FIGS. 1B and 1C, the control gate preferably continues above thick oxide 3 at the locations of the contacting areas.

In the MOS transistor illustrated in FIGS. 2A, 2B, 2C, an active area is defined in a portion of the substrate. In the top view of FIG. 2B, the active area corresponds to the inside of a rectangle 30 outside of which exists thick oxide area 3. It should be noted that this substrate portion is not necessarily of the same nature as the P substrate portion in which the EPROM cell is formed. It may be an area in which a P well has been formed by a specific diffusion. The MOS transistor includes a gate 111 separated from the substrate by a thin oxide 31. At the periphery of gate 111 is formed a spacer 113. The source and drain regions correspond to first implantations 116-1, 116-2 delimited by gate 111 and to second implantations 117-1, 117-2 delimited by spacers 113. As previously, the structure is coated with a layer of a thick insulator 23 in which are formed source, drain, and gate contact openings 34, 35, and 36. As in the preceding case, the gate contact preferably is displaced above a thick oxide region.

The representations of FIGS. 1A–1C and 2A–2C are extremely simplified and are only intended for having the type of structure of the described components understood. The illustrated shapes do not correspond to real shapes. Especially, in the contacting areas, instead of forming a single contact opening, several parallel contact openings are generally formed to increase the contact surface area without increasing the surface area of each of the openings. On the other hand, the widths of the various layers are not to scale. As an example, a configuration having the following parameters will be considered:

| | |
|---|---|
| length L of gate 111 of the MOS transistor | 0.25 μm, |
| thickness of gate oxide 31 of the MOS transistor | 5 nm, |
| thickness of tunnel oxide 7 of the EPROM cell | 11 nm, |
| thickness of the polysilicon layer | 100 nm, |
| thickness of ONO layer 9 | 16 nm, |
| thickness of polysilicon layer 11 | 250 nm, |
| total thickness of insulating layer 23 | 1 μm. |

The order of the manufacturing steps of such a structure is for example the following:

1) forming the trenches filled with an insulator to define active areas;
2) implanting P and N wells, respectively for N-channel MOS transistors and P-channel MOS transistors;
3) first EPROM cell manufacturing steps, that is, depositing and etching tunnel oxide 7 and first polysilicon layer 5 and coating by an ONO layer 9;
4) removing layers specific to the EPROM cells in the MOS transistor areas;
5) forming the gate oxides of the MOS transistors;
6) for the MOS transistors and the EPROM cells: forming a second polysilicon level and etching this level along the contour of the MOS transistor gates and of the EPROM cell control gates; forming spacers;
7) depositing a thick insulating layer 23 and forming openings in this thick insulating layer to contact the gate, control gate, source, and drain regions.

Of course, a real process includes many other steps that have not been mentioned herein, especially the various steps of implantation and diffusion to form the source and drain regions and to dope the various polysilicon layers.

As concerns the etching of the contact openings, source and drain openings 24, 25, 34, 35, contact openings on control gates of EEPROM cells 26, and contact openings on gates of MOS transistors 36 are desired to be simultaneously formed. Given that openings 26 and 36 emerge into relatively thick polysilicon layers, there is no particular problem if the etching between oxide 23 and the polysilicon is not extremely selective since the polysilicon thickness is sufficient to absorb a slight overetching.

It should be noted that, in these structures, no contact is provided on polysilicon regions corresponding to the first floating gate polysilicon layer 5, which is generally very thin, of a thickness on the order of 100 nm, to avoid step crossing problems for the following layers. Given the thinness of layer 5, the forming of a contact opening would risk, in case of a poor etch selectivity between oxide 23 and the polysilicon, piercing polysilicon layer 5 and even, after this, the underlying oxide layers. Structures likely to exhibit significant defects would then be obtained.

In integrated circuits including these as previously described, MOS transistors of very small dimensions, having a gate length on the order of 0.25 μm or less, it has been seen that the thickness of the gate oxide is on the order of 5 nm. This means that such transistors cannot securely withstand voltages over 2.5 volts. Now, EPROM cells of the illustrated type, having for example a tunnel oxide thickness on the order of 11 nm, require voltages on the order of 8 to 10 volts for their programming. Thus, if these voltages are desired to be managed by logic circuits included in the integrated circuit itself, it is not possible to directly use the previously-described logic transistors.

In the case of prior technologies, in which the logic transistors could withstand voltages on the order of 4 to 5 volts, the solution generally used was to connect a number of transistors in cascode to divide the voltage across each of them. For example, in technologies where the gate length is on the order of 0.35 μm, a cascode assembly with four stages including for example 10 elementary components would for example be used. However, such structures occupy a very large surface area and become difficult to use when the voltage that each transistor can withstand (i.e., the breakdown voltage) is reduced.

SUMMARY OF THE INVENTION

An object of the present invention thus is to form a MOS transistor compatible by its manufacturing steps with an EPROM cell or a MOS transistor such as previously described, but that can withstand the EEPROM cell programming voltages.

Another object of the present invention is to provide such a transistor that can be made without increasing the number of manufacturing steps but by only modifying the shape of certain masks.

To achieve these and other objects, the present invention provides an integrated circuit including logic MOS transistors, EPROM cells, and high-voltage MOS transistors, in which each EPROM cell includes a floating gate formed from a first polysilicon level above a tunnel oxide and a control gate formed from a second polysilicon level; each logic MOS transistor includes a gate formed from a portion of the second polysilicon level above a very thin oxide; each high-voltage transistor includes a gate corresponding to a portion of the first polysilicon level above a layer of said tunnel oxide, the gate being covered with a portion of the second polysilicon layer, except at locations where a contact is desired to be made with the gate. The uncovered portion of the first polysilicon layer in the high-voltage MOS transistors is coated with a silicon nitride layer.

According to an embodiment of the present invention, the uncovered portions of the first and second polysilicon layers are coated with silicon nitride.

According to an embodiment of the present invention, the drain area of the high-voltage transistors includes a well region separated from the drain area in contact with the channel by a region extending under a thick oxide portion.

A method of manufacturing such an integrated circuit includes the steps of:

depositing and etching, in the regions of the EPROM cells and of the high-voltage transistors, a tunnel oxide region, a first polysilicon region, and an insulating layer;

removing the layers just deposited in the regions where the logic MOS transistors are to be formed and forming the gate oxide of the logic MOS transistors;

depositing and etching a second polysilicon level to form the control gates of the EPROM cells and the gates of the logic MOS transistors as well as a gate encapsulation area of the high-voltage transistors;

forming spacers;

nitriding the upper surfaces of the first and second polysilicon layers and of the drain and source regions;

depositing a thick insulating layer; and opening contacts.

According to an embodiment of the present invention, the nitriding step is preceded by a siliciding step.

According to an embodiment of the present invention, the step of contact opening includes the steps of opening a mask at the desired locations; anisotropically etching the openings, until detecting that silicon nitride areas have been reached; and continuing the etching for a predetermined time to ensure that contact is made with the upper nitride of the gate areas of the high-voltage transistors and with the source and drain areas of the various elements.

The foregoing objects, features and advantages of the present invention, will be discussed in detail in the following non-limiting description of specific embodiments in connection with the accompanying drawings.

DETAILED DESCRIPTION

The various drawings are not to scale, and that their sizing has been arbitrarily expanded to clarify the representation of the described elements. Further, as concerns the specific dimensions, those skilled in the art will call on their experience and, eventually, the specific indications given in the present description.

Figure 3B:
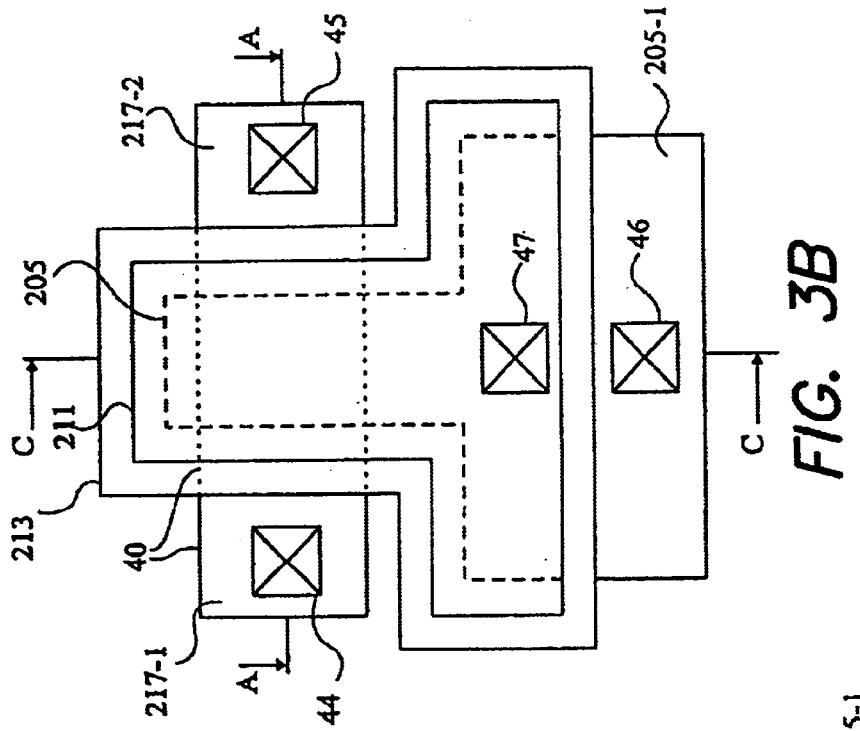
FIGS. 3A, 3B, and 3C respectively show a cross-section view along a first direction, a top view, and a cross-section view along a second direction of a MOS transistor according to the present invention.
Figure 3A:
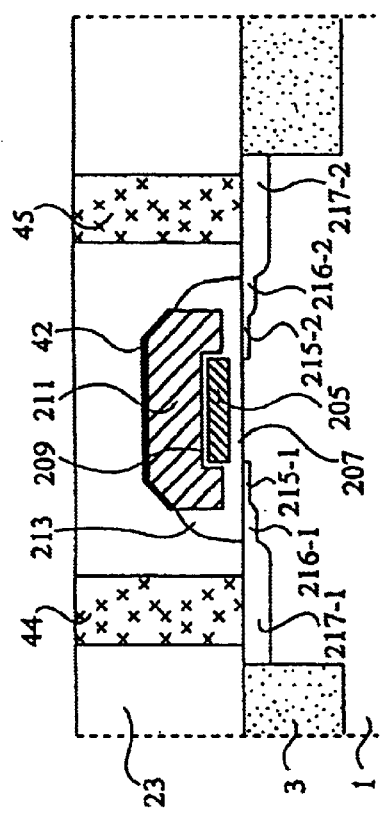
Figure 3C:
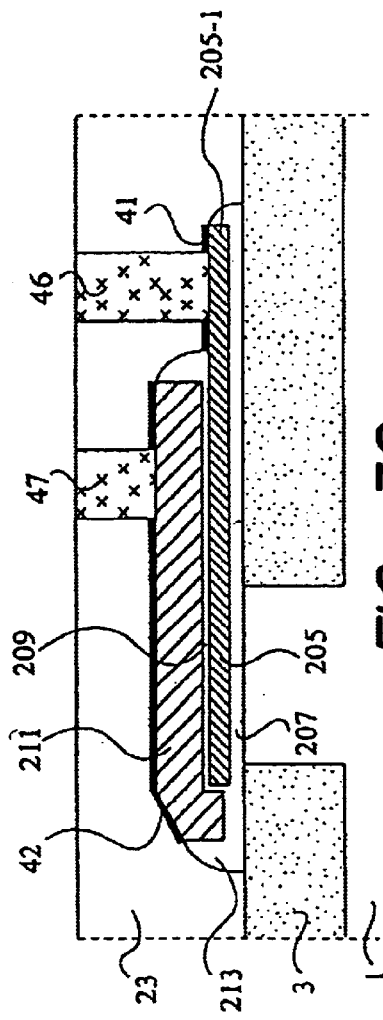

An embodiment of a "high-voltage" transistor according to the present invention is illustrated in FIGS. 3A, 3B, and 3C, FIGS. 3A and 3C being cross-section views along line A—A and along line C—C of FIG. 3B, respectively.

The transistor is formed around an active area 40, illustrated in FIG. 3B. This transistor uses as a gate a portion 205 of the first polysilicon layer formed above an oxide 207 identical to tunnel oxide 7 described in relation with FIG. 1. This oxide has in the considered technology a 11-nm thickness, instead of a 5-nm thickness for the oxide of the logic MOS transistors such as shown in FIG. 2. This 11-nm thickness enables withstanding voltages from 8 to 10 volts on the gate.

Further, a portion 211 of the second polysilicon layer is preferably maintained above and around gate 205 of the transistor. Gate 205 however includes a portion 205-1 that extends beyond portion 211, above thick oxide 3, as shown in FIGS. 3B and 3C.

According to an essential feature of the present invention, just after forming spacers 213 (that correspond to spacers 13 of FIG. 1 and to spacers 113 of FIG. 2), while portion 205-1 of the first polysilicon layer and the upper surface of second polysilicon layer 211 are uncovered, a selective nitriding of the silicon is performed to form a silicon nitride layer 41 above region 205-1 and a silicon nitride layer 42 above layer 211. It should be noted that regions 11 of FIG. 1 and 111 of FIG. 2, as well as the uncovered drain and source surfaces, are simultaneously nitrided.

As a result of this nitriding step, preferably preceded by a siliciding step, drain-source contact openings 44, 45 can be formed at the same time as a control transistor gate contact opening 46 above region 205-1. An opening 47 is also preferably formed above region 211 to later short-circuit gate 205 of the transistor and region 211 covering it. An advantage of the nitriding is that the etching of the silicon oxide forming layer 23 is extremely selective with respect to the silicon nitride etching. During the etching, the time when opening 47 reaches the upper surface of silicon nitride 42 covering layer 211 is first detected. The etching is then carried on for a determined time to be sure that opening 46 reaches the upper surface of silicon nitride 41 and that openings 44 and 45 reach the upper nitrided surface of the drain and source regions. During this second etch step, due to the high oxide/nitride etch selectivity, there is no risk of crossing the nitride layers, to then cross the very thin polysilicon layer 205 in its region 205-1. Once the openings have been formed, a selective etching of the silicon nitride at the bottom of the openings will be performed before conventionally forming metal vias in the openings.

Figure 1B:
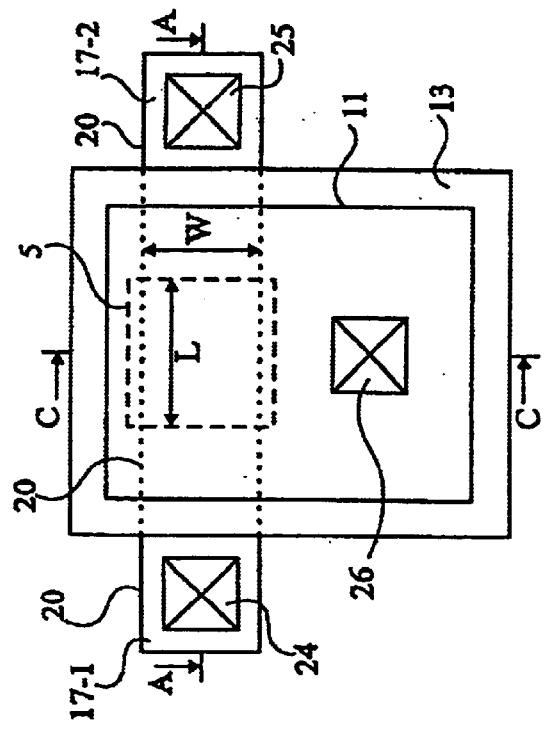
FIGS. 1A, 1B, and 1C respectively show a cross-section view along a first direction, a top view, and a cross-section view along a second direction of a conventional EPROM cell.
Figure 1A:
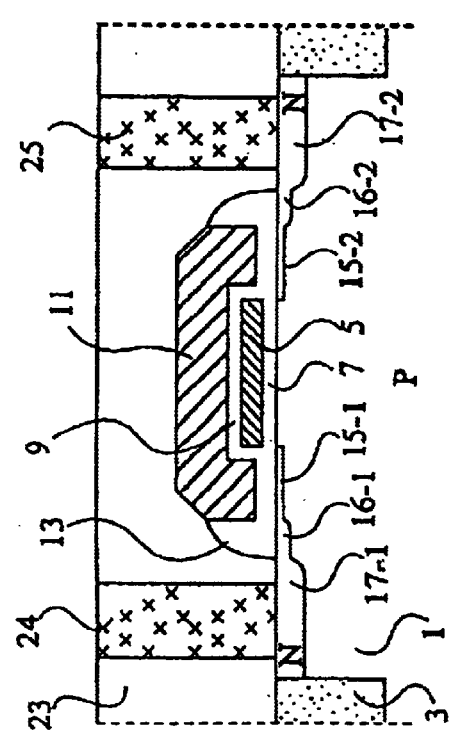
Figure 1C:
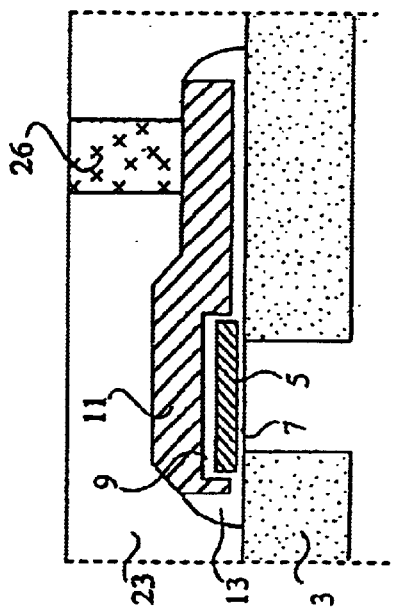
Figure 2C:
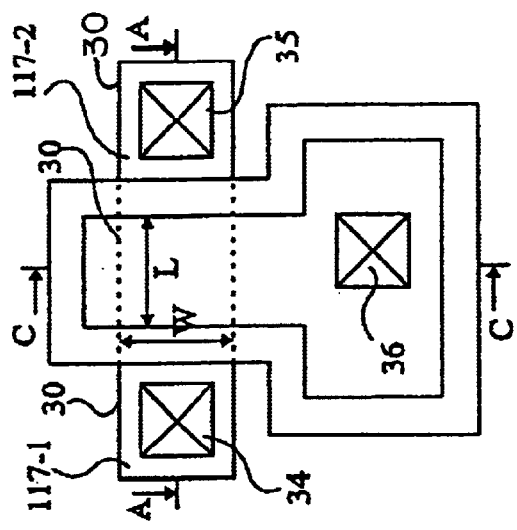
FIGS. 2A, 2B, and 2C respectively show a cross-section view along a first direction, a top view, and a cross-section view along a second direction of a conventional logic MOS transistor.
Figure 2B:
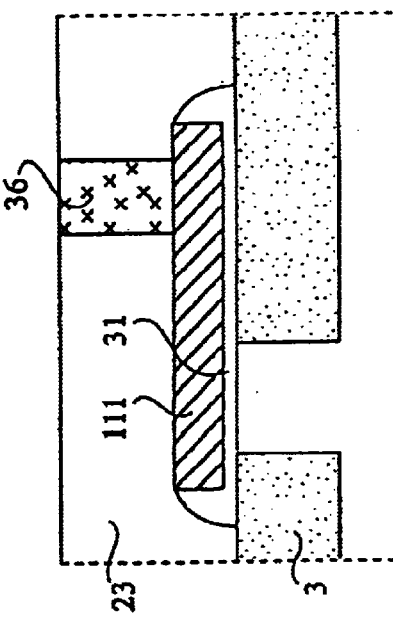
Figure 2A:
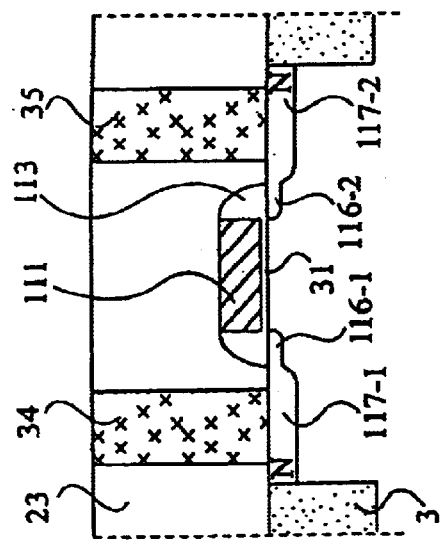

Thus, the "high-voltage" transistor according to the present invention is perfectly compatible with the EPROM cell manufacturing method described in relation with FIG. 1 and the logic MOS transistor manufacturing method described in relation with FIG. 2. Indeed, considering previously-described manufacturing steps 1 to 7:

the first two steps are common;
in the third step, at the same time as tunnel oxide 7 polysilicon 5, and ONO layer 9 are formed and delimited, gate oxide 207, gate 205, and insulator 209 of the high-voltage transistor are formed;
at the fourth step, layers 207, 205, 209 formed under the high-voltage transistor region are maintained like regions 7, 5, 9 formed in the EPROM cell region;
the fifth step does not concern the high-voltage MOS transistors;
at the sixth step, second polysilicon level region 211 is formed at the same time as regions 11 and 111; during the etching of region 211, it is ascertained to let a portion 205-1 of the first polysilicon level extend beyond the rest, as shown in FIG. 3C; the spacer forming is the same; and
the seventh step is common; the forming of openings 44 to 47 of the transistor according to the present invention is performed at the same time as the forming of openings 24–26 of the EPROM cells and 34–36 of the logic MOS transistors.

The only additional step is a nitriding step that acts both upon the uncovered portions of the second polysilicon level, on portion 205-1 of the first polysilicon level forming the gate of the transistors according to the present invention, and on the drain and source regions.

Thus, the method according to the present invention adds no masking step to the conventional method. Only the shape of the masks is modified at the level of the high-voltage transistors to be formed.

Figure 4A:
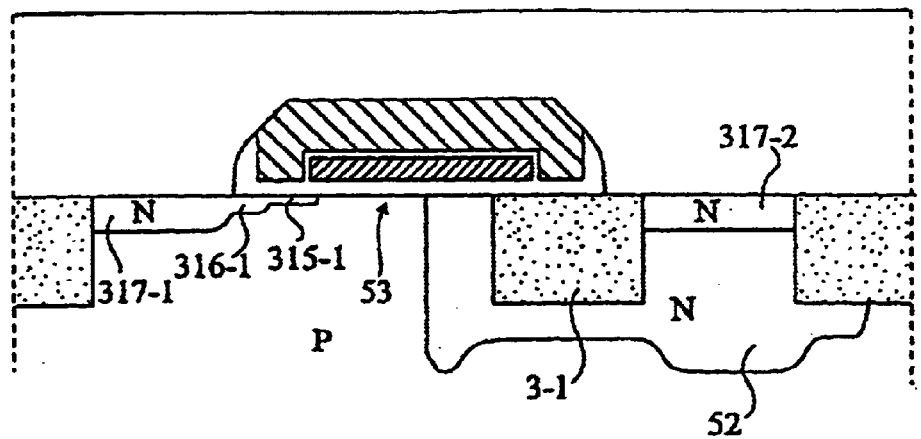
FIGS. 4A, 4B show a cross-section view and a top view of an alternative embodiment of a MOS transistor according to the present invention.
Figure 4B:
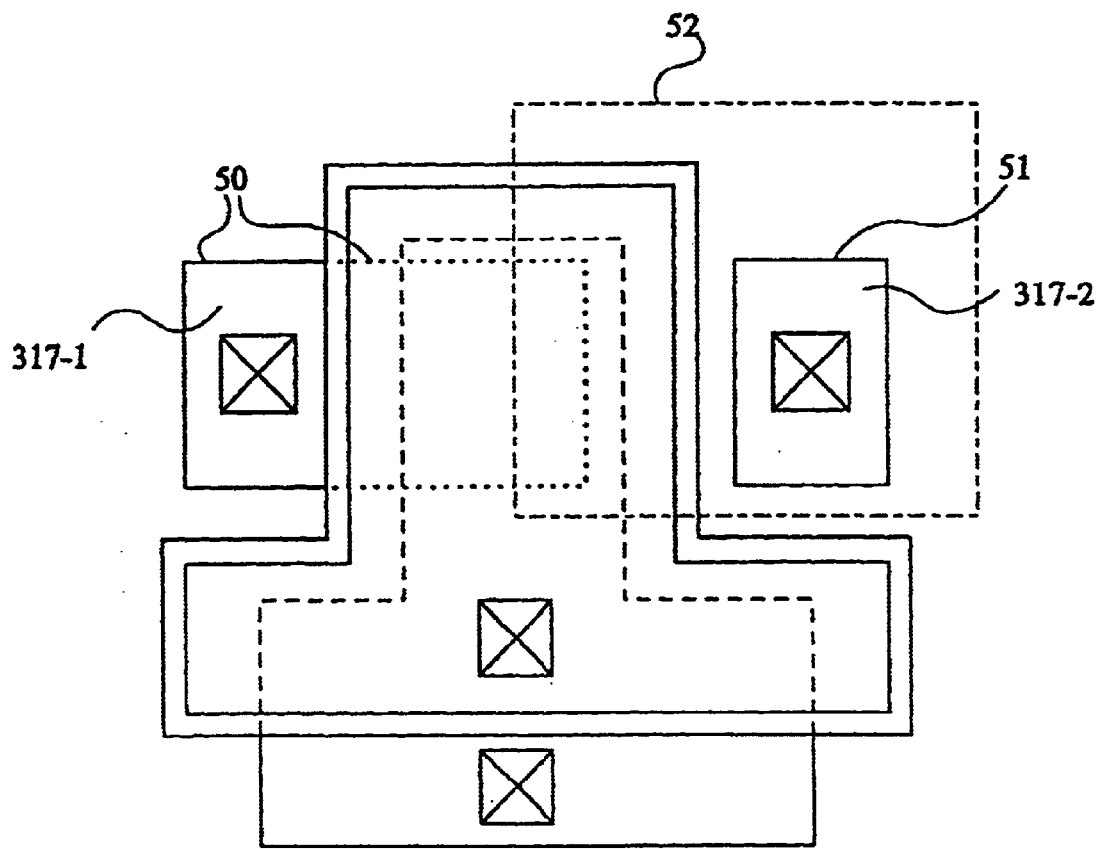

FIGS. 4A and 4B show views similar to the views of FIGS. 3A and 3B and illustrate an alternative embodiment of a transistor according to the present invention. No cross-section view similar to that in FIG. 3C has been shown, since it would be identical.

The structure of FIG. 4 is identical to that of FIG. 3 on the source side. It differs therefrom by the structure on the drain side, this drain side structure being of drift drain type. To better understand the structure, reference will first be made to the top view of FIG. 4B. The active area is delimited on the one hand by a rectangle 50 that, on the source side, is substantially identical to rectangle 40 of FIG. 3B. However, this active area is interrupted before the external limit of the gate and another active drain area 51 is defined on the drain side, spaced apart from the gate, substantially as shown. A rectangle 52 defines the limit of an N well implantation, similar to that performed at the locations where P-channel logic MOS transistors are desired to be formed. In FIG. 4A, the same reference 52 has been used to designate the effect of the implantation performed in the opening of mask 52. It can be seen that channel area 53 of the transistor extends between the limit of diffused region 315-1 that corresponds to region 215-1 of FIG. 3A and the limit of N well 52. Then, the drain region passes under an insulation trench 3-1 before joining a contact region 317-2 that corresponds to region 217-2 of FIG. 3A. The low doping level of N well 52 generates a depletion area of the junction and thus a distribution of the electric field. The field seen by the oxide is then low, which avoids breakdown risks.

Of course, the present invention is likely to have various alterations, modifications, and improvements which will readily occur to those skilled in the art, especially as concerns the sizes that may be chosen in ranges at least 50% around the values indicated as an example. Similarly, the materials, and especially the insulating materials, may be chosen to be of various natures. Although an N-channel MOS transistor has been described as an example, the present invention of course also applies to the forming of a P-channel MOS transistor, by appropriately modifying the various conductivity types. Finally, as indicated previously, the topologies of the various components may be chosen by those skilled in the art according to uses and to the searched specific imperatives.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit including logic MOS transistors, EPROM cells, and high-voltage MOS transistors, in which:
each EPROM cell includes a floating gate formed from a first polysilicon layer above a tunnel oxide and a control gate formed from a second polysilicon layer;

each logic MOS transistor includes a gate formed from a portion of the second polysilicon layer above a very thin oxide;

each high-voltage MOS transistor includes a gate corresponding to a portion of the first polysilicon layer above a layer of said tunnel oxide, the gate being covered with a portion of the second polysilicon layer, except at locations where a first contact is desired to be made with the gate;

wherein a first portion of the first polysilicon layer in the high-voltage MOS transistors not covered by the second polysilicon layer is coated with a first silicon nitride layer.

2. The integrated circuit of claim 1, wherein upper portions of the first and second polysilicon layers are coated with silicon nitride.

3. The integrated circuit of claim 1, wherein a drain region of the high-voltage transistors includes a well region separated from an area of the drain in contact with a channel by a region extending under a thick oxide portion.

4. The integrated circuit according to claim 1, wherein the first contact of each high-voltage MOS transistor is provided to the first polysilicon layer through the first silicon nitride layer and a second contact of each high-voltage MOS transistor is provided to the second polysilicon layer.

5. The integrated circuit according to claim 1, further comprising an insulating layer in an overlap region between the first polysilicon layer and the second polysilicon layer.

6. The integrated circuit according to claim 5, wherein the insulating layer is thicker than the very thin oxide.

7. The integrated circuit according to claim 5, wherein the insulating layer in the overlap region and the first nitride layer over the first portion are laterally separated from each other by oxide spacers.

8. The integrated circuit according to claim 1, further comprising a second silicon nitride layer disposed over the second polysilicon layer.

9. The integrated circuit according to claim 8, wherein contacts to each EPROM cell control gate, each logic MOS transistor gate and each high-voltage MOS transistor gate are provided through at least one of the first and second silicon nitride layers.

10. The integrated circuit of claim 8, wherein a first contact of each high-voltage MOS transistor is provided to the first polysilicon layer through the first silicon nitride layer and a second contact of each high-voltage MOS transistor is provided to the second polysilicon layer through the second silicon nitride layer.

11. The integrated circuit of claim 1, wherein the tunnel oxide has a thickness of approximately 11 nanometers.

12. The integrated circuit of claim 1, further comprising an oxide-nitride-oxide (ONO) layer over the first polysilicon layer in at least some regions covered by the second polysilicon layer.

13. The integrated circuit of claim 12, wherein the ONO layer has a thickness of approximately 16 nanometers.

14. The integrated circuit of claim 1, wherein the first polysilicon layer has a thickness of approximately 100 nanometers.

15. The integrated circuit of claim 1, wherein the second polysilicon layer has a thickness of approximately 250 nanometers.

16. The integrated circuit of claim 12, wherein the gate of each high-voltage MOS transistor is formed over the tunnel oxide layer and separated from the second polysilicon layer by the ONO layer.

17. The integrated circuit of claim 16, wherein the tunnel oxide has a thickness sufficient to withstand approximately 8–10 volts.

18. The integrated circuit of claim 1, wherein each high-voltage MOS transistor is adapted to withstand a programming voltage of the EPROM cells.

19. The integrated circuit of claim 1, wherein the very thin oxide has a thickness of approximately 5 nanometers.

20. The integrated circuit of claim 1, wherein each high-voltage MOS transistor is adapted to withstand a programming voltage of the EPROM cells and each logic MOS transistor is adapted to withstand a logic voltage.

21. The integrated circuit of claim 20, wherein the logic voltage is less than or equal to 5 volts.

22. The integrated circuit of claim 8, wherein contacts to each high-voltage MOS transistor, each EEPROM cell, and each logic MOS transistor are formed through at least one of the first and second silicon nitride layers.

23. An integrated circuit formed in a substrate of a first conductivity type, the integrated circuit comprising:

at least one EPROM cell;

at least one MOS transistor adapted to withstand a programming voltage of the at least one EPROM cell; and at least one logic transistor, wherein etched portions of a first conductive layer provide a floating gate of the at least one EPROM cell and a control gate of the at least one MOS transistor, etched portions of a second conductive layer provide a control gate of the at least one EPROM cell and a control gate of the at least one logic transistor, etched portions of a first oxide layer form a tunnel oxide of the at least one EPROM cell and the at least one MOS transistor, and active regions of the at least one MOS transistor are formed in the substrate including a drain region, the drain region comprising:

a well region of a second conductivity type formed in the substrate, a first portion of the well region below the control gate and a contact portion within the well region, wherein a conductance path connects the contact portion and the first portion, the conductance path beneath a region of insulating material, the insulating material within the well region.

24. The integrated circuit according to claim 23, wherein the etched portions of the second conductive layer also provide an overlap region of the at least one MOS transistor, the overlap region covering the control gate of the at least one MOS transistor except in a contact region of the at least one MOS transistor.

25. The integrated circuit according to claim 24, further comprising a silicon nitride layer disposed at least over the second conductive layer and the contact region of the at least one MOS transistor and portions of the active regions of the at least one MOS transistor.

26. The integrated circuit according to claim 25, wherein contacts to the at least one EPROM cell, the at least one MOS transistor, the at least one logic transistor, and the active regions of the at least one MOS transistor are formed through the silicon nitride layer.

* * * * *